United States Patent [19]
Bothra et al.

[11] Patent Number: 5,963,784
[45] Date of Patent: Oct. 5, 1999

[54] METHODS OF DETERMINING PARAMETERS OF A SEMICONDUCTOR DEVICE AND THE WIDTH OF AN INSULATIVE SPACER OF A SEMICONDUCTOR DEVICE

[75] Inventors: Subhas Bothra, San Jose; Xi-Wei Lin, Fremont, both of Calif.

[73] Assignee: VLSI Technology, Inc., San Jose, Calif.

[21] Appl. No.: 08/853,853

[22] Filed: May 9, 1997

[51] Int. Cl.$^6$ .......................... G01R 31/26; G01R 27/08; H01L 21/66

[52] U.S. Cl. ................................. 438/18; 324/716

[58] Field of Search ....................... 438/18, 17; 324/716, 324/719, 765

[56] References Cited

U.S. PATENT DOCUMENTS

| | | | |
|---|---|---|---|
| 3,974,443 | 8/1976 | Thomas | 324/716 |
| 4,347,479 | 8/1982 | Cullet | 324/158 |
| 4,672,314 | 6/1987 | Kokkas | 324/64 |
| 4,753,897 | 6/1988 | Lund et al. | 437/41 |
| 4,876,213 | 10/1989 | Pfiester . | |
| 4,902,640 | 2/1990 | Sachitano et al. . | |
| 4,978,627 | 12/1990 | Liu et al. | 437/44 |
| 5,304,255 | 4/1994 | Ebina | 324/719 |
| 5,399,513 | 3/1995 | Liou et al. . | |
| 5,780,362 | 7/1998 | Wang et al. | 438/683 |

OTHER PUBLICATIONS

Huang, "Using the Cross–Bridge Structure to Monitor the Effective Oxide Sidewall–Spacer Width in LDD Transistors," IEEE Electron Device Letters, vol. EDL–6, No. 5, May 1985.

*Primary Examiner*—Brian Dutton
*Attorney, Agent, or Firm*—Wells, St. John, Roberts, Gregory & Matkin P.S.

[57] ABSTRACT

The present invention provides methods of determining a smallest dimension of a fabricated device on a semiconductor substrate, methods of determining width of a structure comprising a refractory metal silicide, methods of determining parameters of a semiconductor device comprising a refractory metal silicide, and methods of determining width of an insulative spacer of a semiconductor device. One aspect of the present invention provides a method of determining a smallest dimension of a fabricated device on a semiconductor substrate comprising: providing a first substrate area and a second substrate area; subjecting the first substrate area and the second substrate area to the same processing conditions to achieve regions of like material on the first and second substrate areas, the like material in the first area having a smallest dimension which is greater than a smallest dimension of the like material in the second area; determining parameters of the first substrate area; and determining said smallest dimension of the like material in the second substrate area using the determined parameters of the first substrate area.

53 Claims, 4 Drawing Sheets

# METHODS OF DETERMINING PARAMETERS OF A SEMICONDUCTOR DEVICE AND THE WIDTH OF AN INSULATIVE SPACER OF A SEMICONDUCTOR DEVICE

TECHNICAL FIELD

The present invention relates to methods of determining parameters of a semiconductor device and the width of an insulative spacer of a semiconductor device.

BACKGROUND OF THE INVENTION

The polysilicon critical dimension (CD) is an important parameter in semiconductor fabrication. In particular, the critical dimension of the polysilicon determines the $L_{\mathit{eff}}$ which impacts the transistor properties. This parameter should be accurately controlled in a MOS fabrication facility.

The polysilicon linewidth may be typically determined by using the measured line resistance and sheet resistance of the substrate. Sheet resistance is measured in Ohms/square and is defined as the resistivity of the substrate divided by the substrate's thickness. The sheet resistance of a substrate is the resistance measured between the opposite sides of a square of that substrate.

The width of a polysilicon structure is typically calculated from the measured resistance of the polysilicon structure and the sheet resistance of the polysilicon structure. In particular, the width of the polysilicon structure may be determined from the following equation:

$$W_{poly} = (R_{\square poly} L)/R_{poly}$$

where $R_{poly}$ is the measured resistance of the polysilicon structure, L is the length of the polysilicon structure, $R_{\square poly}$ is the sheet resistance of the polysilicon structure, and $W_{poly}$ is the width of the polysilicon structure.

The above-described techniques are not applicable to semiconductor fabrication processes utilized to produce semiconductor devices having a polysilicon and silicide structure less than 0.5 microns in width. More particularly, the sheet resistance of a refractory metal silicide structure becomes linewidth dependent for lines smaller than 0.5 microns in width.

Referring to FIG. 1, the sheet resistance of a refractory metal silicide structure is shown with respect to the linewidth of the refractory metal silicide structure. In particular, line 6 represents the sheet resistance of the refractory metal silicide structure in Ohms/square for a given range of linewidths from 0.25 microns to 0.8 microns. FIG. 1 shows that the sheet resistance of a refractory metal silicide structure becomes linewidth dependent for lines smaller than 0.5 microns in width.

To overcome this problem, conventional techniques used physical SEM measurements. Such techniques have significant drawbacks including being non-electrical, consuming substantial amounts of time and not allowing measurements after the semiconductor wafer is completely processed.

It would be desirable to overcome these and other drawbacks associated with the conventional methods of measuring the critical dimension of a refractory metal silicide structure.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

Figure 1:
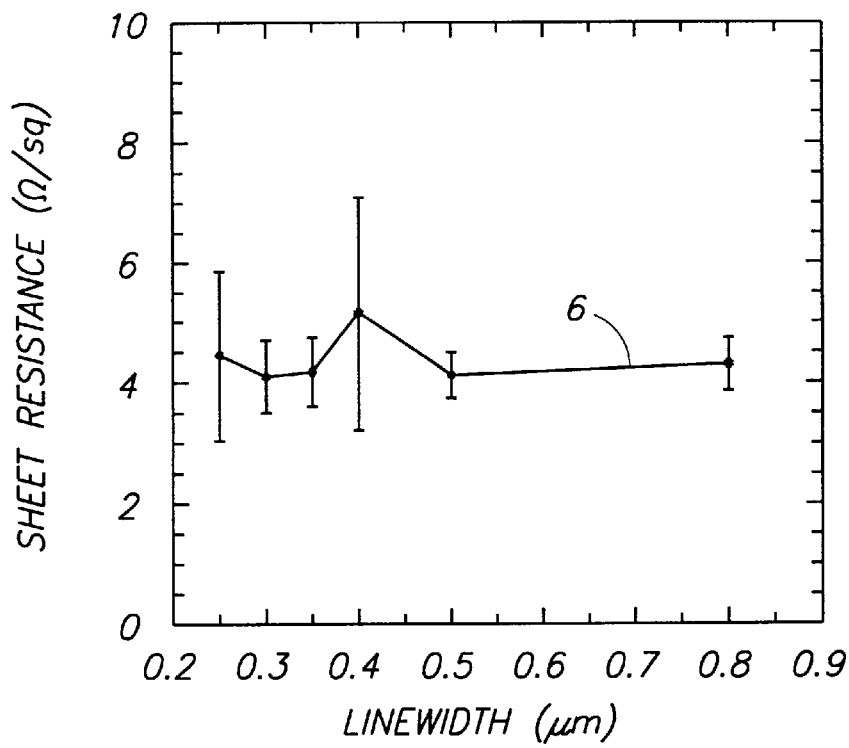
FIG. 1 is a conventional graphical representation of the sheet resistance of a refractory metal silicide structure versus the linewidth of the refractory metal silicide structure.

This disclosure of the invention is submitted in furtherance of the constitutional purposes of the U.S. Patent Laws "to promote the progress of science and useful arts" (Article 1, Section 8).

The present invention provides methods of calculating parameters, including critical dimensions, of semiconductor devices comprising a refractory metal silicide structure.

In accordance with one aspect of the present invention, a method of determining a smallest dimension of a fabricated device on a semiconductor substrate comprises: providing a first substrate area and a second substrate area; subjecting the first substrate area and the second substrate area to the same processing conditions to achieve regions of like material on the first and second substrate areas, the like material in the first area having a smallest dimension which is greater than a smallest dimension of the like material in the second area; determining parameters of the first substrate area; and determining said smallest dimension of the like material in the second substrate area using the determined parameters of the first substrate area.

A second aspect of the present invention provides a method of determining width of a structure comprising a refractory metal silicide, the width being less than 0.5 microns and the method comprises: forming first and second field effect transistors having a common device width, the first field effect transistor comprising a first gate comprising a refractory metal silicide having a width of greater than or equal to 0.5 microns, the second field effect transistor comprising a diffusion region and a second gate comprising the same refractory metal silicide having a width of less than 0.5 microns, the first and second gates having insulative lateral spacers of a substantially common width and common material; determining the common device width; determining the common width of the insulative spacers; determining the width of the diffusion region of the second field effect transistor; and determining the width of the second gate using the device width, the width of the diffusion region of the second field effect transistor and the common width of the insulative spacers.

According to yet another aspect of the present invention, a method of determining parameters of a semiconductor device comprising a refractory metal silicide comprises: providing a first semiconductor structure having a first device length and including a diffusion region having a diffusion width; determining the diffusion width of the diffusion region of the first semiconductor structure; providing a second semiconductor structure having a second device length and including a first refractory metal silicide structure having a first width and a spacer having a spacer width; determining the spacer width; providing a third semiconductor structure having a third device length and including a second refractory metal silicide structure having a second width and a spacer of the spacer width, the second width being less than the first width, the first refractory metal silicide structure and the second refractory metal silicide structure being formed of the same refractory metal silicide; and determining the second width using at least the determined diffusion width and the determined spacer width.

In accordance with another aspect of the present invention, a method of determining the width of an insulative spacer of a semiconductor device comprises: providing a first semiconductor structure comprising a first diffusion region, the first semiconductor structure having a device width; providing a second semiconductor structure of the device width and comprising a refractory metal silicide structure, a second diffusion region and an insulative spacer; determining the device width; determining the width of the refractory metal silicide structure; determining the diffusion width of the second diffusion region; and subtracting the width of the refractory metal silicide structure and the diffusion width of the second diffusion region from the device width.

Figure 2:
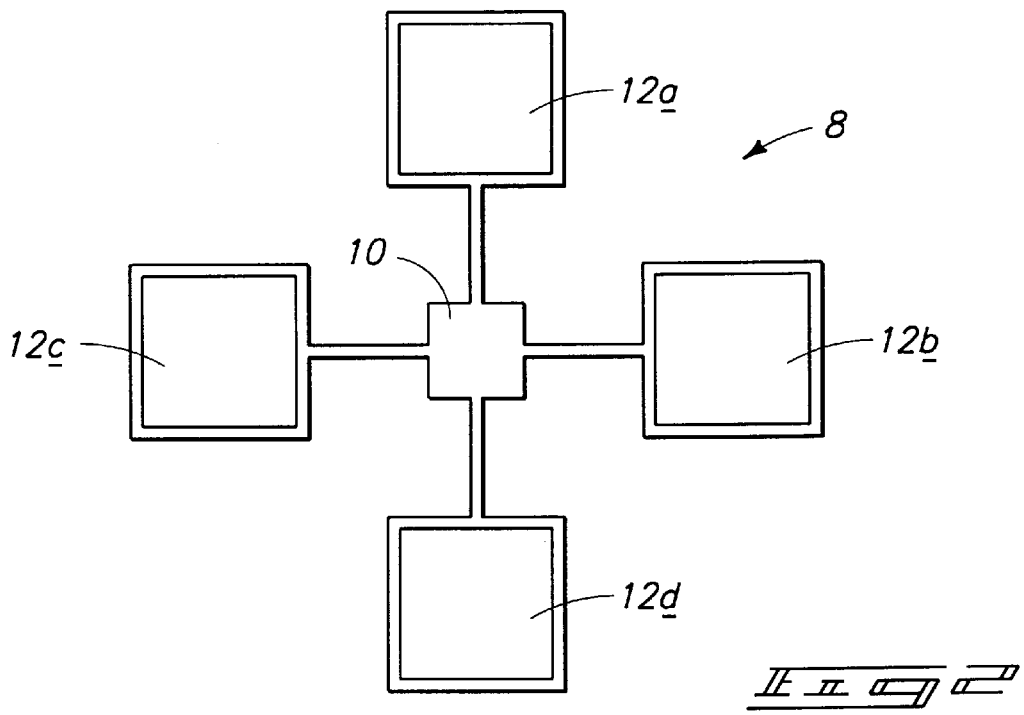
FIG. 2 is an illustrative view of a Van der Pauw structure coupled with a test substrate.

Referring to FIG. 2, a Van der Pauw test structure 8 may be utilized for providing sheet resistance measurements for determining device parameters. The Van der Pauw structure 8 comprises a plurality of pads 12a–12d coupled with a test substrate 10, such as a semiconductor substrate. The Van der Pauw structure 8 is utilized to determine the sheet resistance of the semiconductor test substrate 10. A plurality of pads 12a–12d are coupled with the semiconductor test substrate 10 as shown in FIG. 2. To determine the sheet resistance of the semiconductor test substrate 10, a voltage differential is applied across first pad 12a and second pad 12b. A current source is coupled with third pad 12c and is utilized to supply a current to the pad.

The voltage intermediate first pad 12a and second pad 12b and the current intermediate third pad 12c and fourth pad 12d are measured. Thereafter, a voltage differential is applied across pads 12b and 12d. A current is applied to first pad 12a. The voltage intermediate pads 12b, 12d and the current intermediate pads 12a, 12c are measured. The sheet resistance ($R_{\square test}$) of the semiconductor test substrate 10 being analyzed is calculated by:

$$R_{\square test} = 4.53 \times (V/I)$$

where $V = (|Vab(+Icd)| + |Vab(-Icd)| + |Vbd(+Iac)| + |Vbd(-Iac)|)/4$ and $I = |Icd| = |Iac|$.

A diffusion test substrate is coupled with the test pads 12 to provide the diffusion sheet resistance. A refractory metal silicide test substrate comprising polysilicon and a silicide layer is coupled with the test pads 12 to provide the refractory metal silicide sheet resistance. The sides of the refractory metal silicide test substrate individually have a width in excess of 0.5 microns. Alternately, other methods of calculating the diffusion sheet resistance and the refractory metal silicide sheet resistance may be used.

Figure 3:
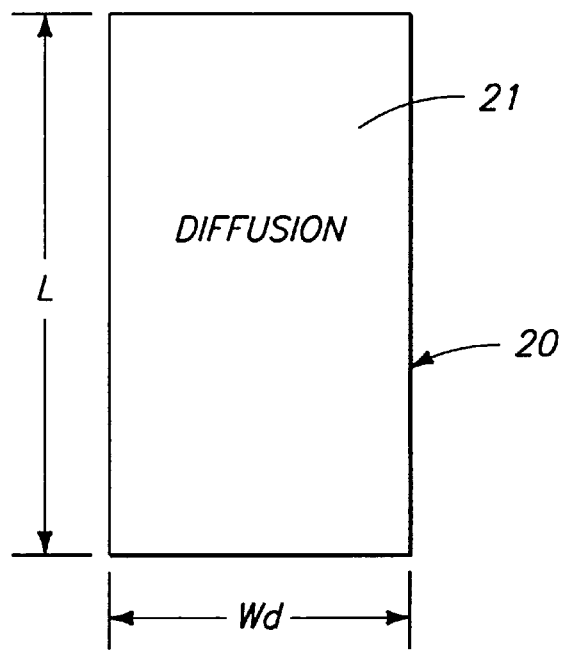
FIG. 3 is a plan view of a first semiconductor structure.

Referring to FIG. 3, a first semiconductor structure 20 is formed within a semiconductor substrate. The semiconductor substrate comprises silicon, gallium arsenide or other suitable semiconducting material. First semiconductor structure 20 has a device length L and a device width $W_d$ and comprises a first diffusion region 21. First semiconductor structure 20 may be formed utilizing conventional diffusion techniques.

In particular, diffusion region 21 may be formed through the utilization of a mask which defines the size of the diffusion region 21. The mask has at least one opening which defines the device length L and device width $W_d$. The mask allows selected areas of the substrate to be converted to a n type or p type diffusion region by exposing the area of the semiconducting substrate to a preselected chemical (e.g., a chemical containing arsenic, boron, phosphorous) at a high temperature for a sufficient period of time.

Although the mask opening generally defines the dimensions of the diffusion region being formed, the actual dimensions of the device may vary from the dimensions of the mask opening. For example, the chemical may diffuse slightly outside of the area defined by the mask opening thereby resulting in a diffusion region 21 which is slightly larger than the opening of the mask. Therefore, it is often necessary to determine the actual diffusion width ($W_{1diff}$) of first diffusion region 21.

The actual diffusion width of the first diffusion region 21 of the first semiconductor structure 20 is calculated by:

$$W_{1diff} = (R_{\square diff} L)/R_{1diff}$$

where $R_{1diff}$ is the measured resistance of the first semiconductor structure 20. L is the semiconductor device length of the first semiconductor structure 20 and $R_{\square diff}$ is the sheet resistance of the first diffusion region 21.

Following the determination of the actual diffusion width $W_{1diff}$ of the first diffusion region 21, the difference ($\Delta W_{diff}$) between the width of the opening of the mask ($W_{1m}$) utilized to form region 21 and the actual diffusion width thereof $W_{1diff}$ may be determined according to:

$$\Delta W_{diff} = W_{1m} - W_{1diff}.$$

Figure 4:
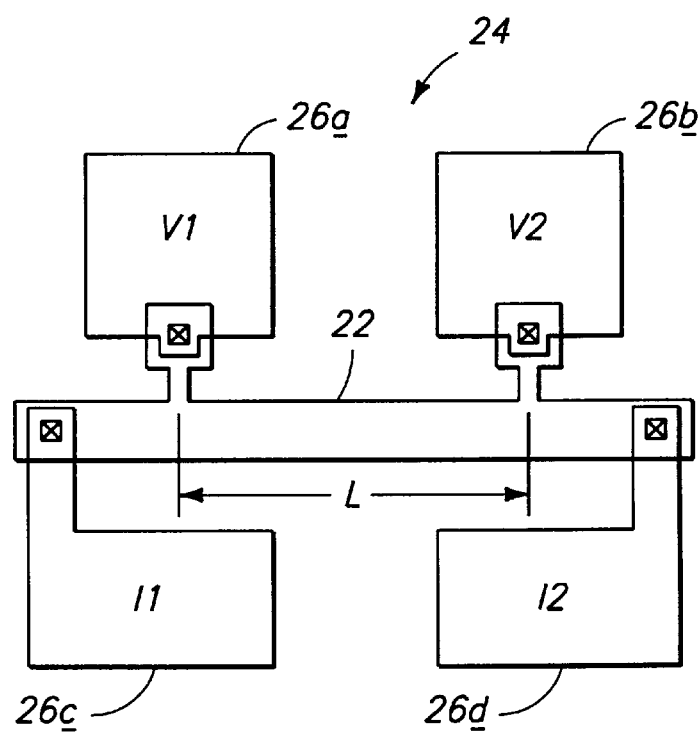
FIG. 4 is an illustrative view of a bridge resistor test structure.

Referring to FIG. 4, a method of measuring resistances (e.g., the resistance of the first diffusion region 21 ($R_{1diff}$)) of semiconductor structures is shown. The depicted method utilizes a bridge resistor test structure 24. Bridge resistor test structure 24 comprises a plurality of taps 26a–26d attached to a test substrate 22, such as a portion of first semiconductor structure 20. Bridge resistor test structure 24 provides an actual resistance measurement of a predetermined length L of the test substrate 22.

More specifically, a plurality of taps are electrically coupled with the test substrate 22. Voltage measuring taps 26a and 26b are displaced from current measuring taps 26c and 26d as shown in FIG. 4. Current is injected via first current tap 26c and the current (Icd) between first current tap 26c and second current tap 26d is measured. The voltage differential (Vab) is measured between first voltage tap 26a and second voltage tap 26b during the injection of the current. The measured resistance ($R_{1diff}$) is determined by dividing the measured voltage (Vab) by the measured current (Icd). The semiconductor device length L is measured between the center lines of the respective voltage taps 26a, 26b. The device length L is the length of the semiconductor structure utilized to obtain the measured voltage.

The methods discussed herein of determining sheet resistance and measuring the resistances of the diffusion regions and the refractory metal silicide structures are for exemplary purposes only. The present invention encompasses other methods of determining the sheet resistances and measuring the respective resistances of the diffusion regions and the refractory metal silicide structures.

Figure 5:
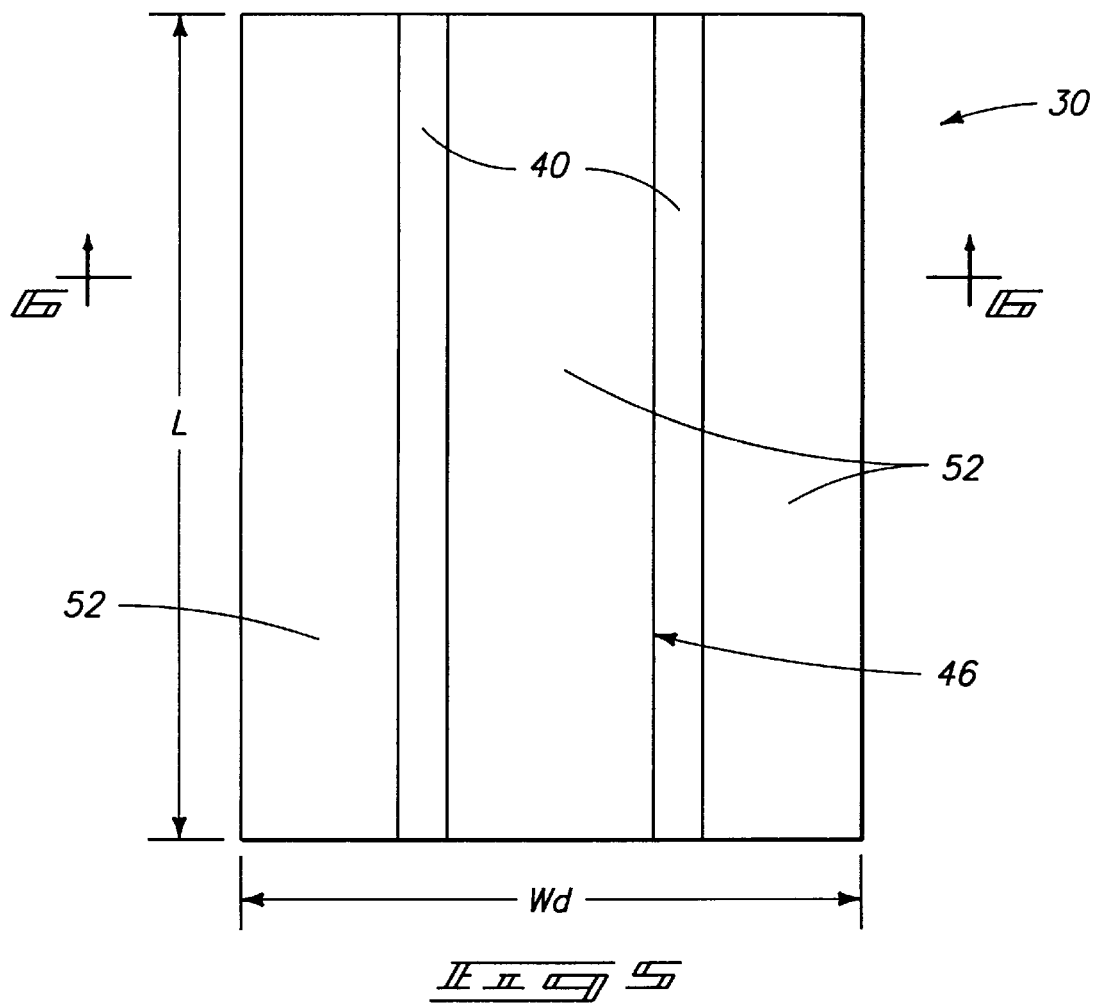
FIG. 5 is a plan view of a second semiconductor structure.
Figure 6:
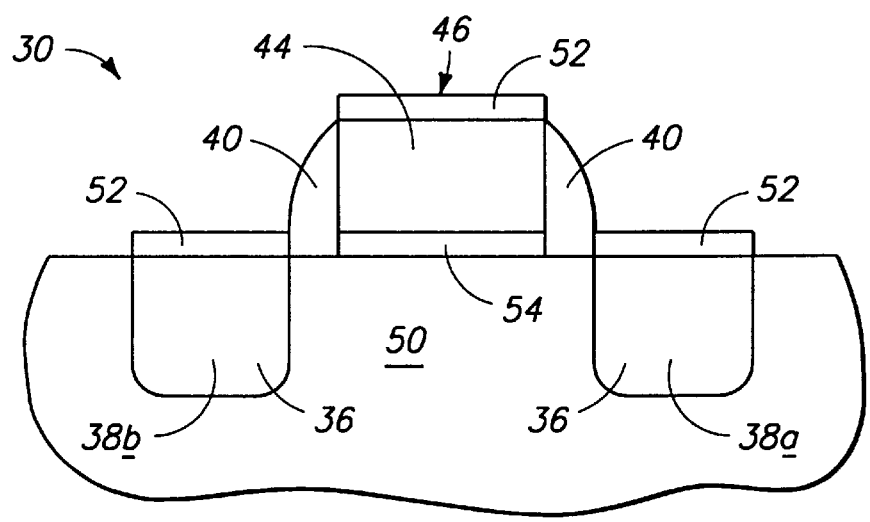
FIG. 6 is a cross-sectional view of the second semiconductor structure shown in FIG. 5.

Referring to FIG. 5 and FIG. 6, a second semiconductor structure 30 is formed within a first substrate area 50 (shown in FIG. 6 only). First substrate area 50 is preferably the same semiconducting material as that which is diffused to form the first semiconductor structure 20. Second semiconductor structure 30 comprises a second diffusion region 36 having a plurality of parallel first diffusion areas 38a, 38b. Second diffusion region 36 is formed by selected diffusion techniques to comprise substantially the same material of first diffusion region 21.

Second semiconductor structure 30 has a device length L and a device width $W_d$. Second semiconductor structure 30 is formed utilizing a mask having an opening of the same width as the opening of the mask utilized to form first semiconductor structure 20. The device width $W_d$ of second semiconductor structure 30 is substantially equal to the device width $W_d$ of first semiconductor structure 20.

Second semiconductor structure 30 comprises a first refractory metal silicide structure 46 intermediate first diffusion areas 38a, 38b. Referring to FIG. 6, first refractory metal silicide structure 46 preferably comprises a first polysilicon structure 44 and a silicide layer 52. A gate oxide layer 54 is provided intermediate polysilicon structure 44 and substrate 50. Insulative spacers 40 are individually formed intermediate respective ones of the first diffusion areas 38a, 38b and the refractory metal silicide structure 46.

Second semiconductor structure 30 comprises additional silicide layers 52 formed upon first diffusion areas 38a, 38b. Silicide layers 52 are typically a refractory metal, such as $TiSi_2$ or $CoSi_2$. Each silicide layer 52 of second semiconductor structure 30 is preferably formed by a salicide process.

First refractory metal silicide structure 46 of second semiconductor structure 30 and parallel diffusion areas 38a, 38b individually have a width greater than or equal to approximately 0.5 microns. As described above with reference to FIG. 2, the sheet resistance of refractory metal silicide structures is not linewidth dependent for widths in excess of 0.5 microns. The width of insulative spacers 40 may be determined utilizing first semiconductor structure 20 and second semiconductor structure 30 provided the widths of first refractory metal silicide structure 46 and diffusion areas 38a, 38b are individually in excess of 0.5 microns.

One method of calculating the width of spacers 40 is described hereafter. Utilizing the bridge resistor test structure 24 described above with reference to FIG. 4, the resistance ($R_{2diff}$) of the second diffusion region 36 of the second semiconductor structure 30 (i.e., first diffusion areas 38a, 38b) and the resistance of the first refractory metal silicide structure 46 ($R_{1sil}$) are measured. The first diffusion areas 38a, 38b are measured in parallel.

The sheet resistance of first refractory metal silicide structure 46 is next determined. Since the width of first refractory metal silicide structure 46 is greater than 0.5 microns, the sheet resistance of first refractory metal silicide structure 46 ($R_{\square 1sil}$) is determined from the Van der Pauw structure 8 shown in FIG. 2. A test substrate 10 including a polysilicon layer and silicide layer is utilized to determine the sheet resistance $R_{\square 1sil}$ of the first refractory metal silicide structure 46.

The actual width of first refractory metal silicide structure 46 ($W_{1sil}$) is next determined by the following equation:

$$W_{1sil}=(R_{\square 1sil}L)/R_{1sil}.$$

L is the length of the second semiconductor structure 30 provided between voltage contacts 26a, 26b of the bridge resistor test structure 24 and utilized to make the resistance measurement $R_{1sil}$.

Following the determination of the width of the first refractory metal silicide structure 46, the actual diffusion width of the second diffusion region 36 ($W_{2diff}$) is determined. $R_{\square diff}$ is the measured diffusion sheet resistance provided by the Van der Pauw structure 8. The resistance of the diffusion region 36 of the second semiconductor device 30 ($R_{2diff}$) is measured utilizing bridge resistor test structure 24. The diffusion width of the second diffusion region 36 may be determined by the following equation:

$$W_{2diff}=(R_{\square diff}L)/R_{2diff}.$$

L is the length of the second semiconductor structure 30 provided between voltage contacts 26a, 26b of the bridge resistor test structure 24 and utilized to make the resistance measurement $R_{2diff}$.

The width of respective spacers 40 ($W_s$) is thereafter determined by:

$$W_s=(W_{1diff}-W_{2diff}-W_{1sil})/2.$$

The spacer width $W_s$ may be subsequently utilized to determine the width of a refractory metal silicide structure having a width less than 0.5 microns as is hereafter discussed in detail.

Figure 7:
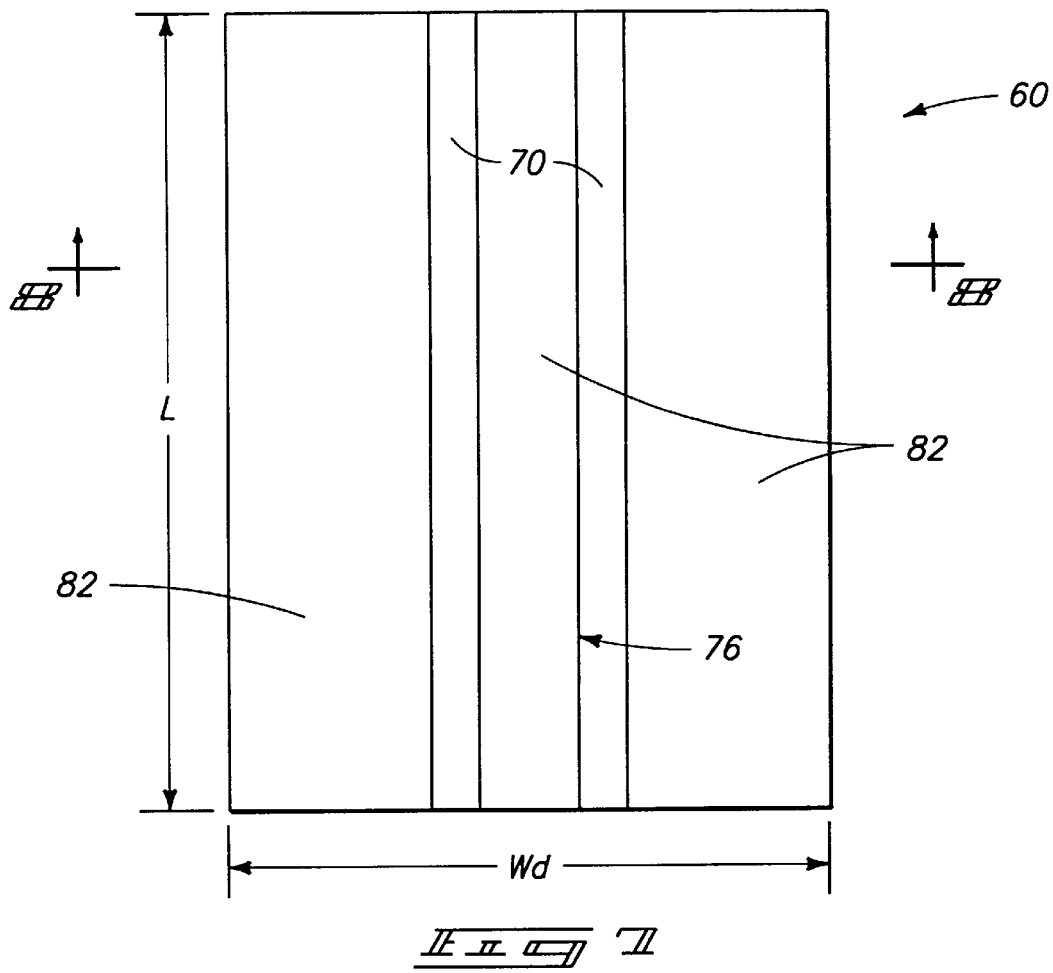
FIG. 7 is a plan view of a third semiconductor structure.
Figure 8:
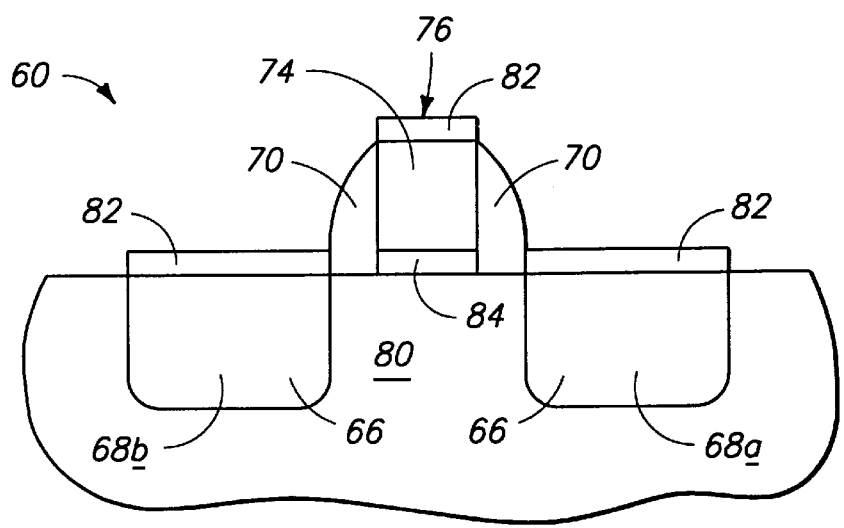
FIG. 8 is a cross-sectional view of the third semiconductor structure shown in FIG. 7.

Referring to FIG. 7 and FIG. 8, a third semiconductor structure 60 is shown. Third semiconductor structure 60 has a length L and a device width $W_d$. Third semiconductor structure 60 is formed utilizing a mask having an opening of the same width as the opening of the mask utilized to form first semiconductor structure 20 and second semiconductor structure 30. The device width $W_d$ of third semiconductor structure 60 is substantially equal to the device width $W_d$ of first semiconductor structure 20 and the device width $W_d$ of second semiconductor structure 30.

First, second and third semiconductor structures 20, 30, and 60 are formed within the same type of semiconductor substrate material (e.g., silicon). Third semiconductor structure 60 is formed within a second substrate area 80 (only shown in FIG. 8). Third semiconductor structure 60 comprises a third diffusion region 66 having a plurality of parallel second diffusion areas 68a, 68b. Third diffusion region 66 is formed to comprise the same material as first diffusion region 21 and second diffusion region 36. Third semiconductor structure 60 additionally comprises a second refractory metal silicide structure 76 intermediate diffusion areas 68a, 68b.

Second substrate area 80 is subjected to the same processing conditions as first substrate area 50 to achieve respective regions of like material comprising first refractory metal silicide structure 46 and second refractory metal silicide structure 76. In particular, second refractory metal silicide structure 76 is formed of the same material as first refractory metal silicide structure 46.

Referring to FIG. 8, second refractory metal silicide structure 76 comprises a second polysilicon structure 74 and a refractory metal silicide layer 82. A gate oxide layer 84 is provided intermediate second polysilicon structure 74 and substrate 80. A plurality of insulative spacers 70 are individually formed intermediate respective ones of the diffusion areas 68a, 68b and the refractory metal silicide structure 76. The utilization of anisotropic etching techniques during the fabrication of semiconductor structures 30, 60 provides spacers 40, 70 having a substantially common spacer width $W_s$.

Third semiconductor structure 60 comprises additional refractory metal silicide layers 82 formed upon second diffusion areas 68a, 68b. Silicide layers 82 typically comprise a refractory metal, such as $TiSi_2$, $CoSi_2$. Similar to the silicide layers 52 of second semiconductor structure 30, silicide layers 82 of third semiconductor structure 60 are preferably formed by a salicide process.

Second refractory metal silicide structure 76 of the third semiconductor structure 60 has a width less than approximately 0.5 microns. As described above with reference to FIG. 1, the sheet resistance of the refractory metal silicide structure 76 is linewidth dependent for widths less than 0.5 microns. Utilizing the methods of the present invention, the width of the second refractory metal silicide structure 76 may be determined. In particular, the width and sheet resistance of the second refractory metal silicide structure 76 may be determined through the use of determined parameters from the first semiconductor structure 20 (i.e., the width of the first diffusion region $W_{1diff}$) and the second semiconductor structure 30 (i.e., the spacer width $W_s$).

The resistance ($R_{3diff}$) of the third diffusion region 66 (i.e., parallel diffusion areas 68a, 68b) and the resistance ($R_{2sil}$) of second refractory metal silicide structure 76 are measured utilizing the bridge resistor test structure 24. The second diffusion areas 68a, 68b are measured in parallel.

The diffusion width of the third diffusion region 66 ($W_{3diff}$) may be determined from:

$$W_{3diff}=(R_{\Box diff}L)/R_{3diff}.$$

$R_{\Box diff}$ is determined utilizing the Van der Pauw structure 8 described above. L is the device length of the third semiconductor structure 60 provided between voltage contacts 26a, 26b of the bridge resistor test structure 24 for obtaining the resistance measurements $R_{3diff}$. The above equation can be used to provide the diffusion width of the third diffusion region 66 $W_{3diff}$ as long as the widths of the diffusion areas 68a, 68b are individually greater than or equal to approximately 0.5 microns.

Utilizing the width $W_s$ of the spacers 40, 70, the width $W_{1diff}$ of the first diffusion region 21, and the width $W_{3diff}$ of the third diffusion region 66, the width ($W_{2sil}$) of the second refractory metal silicide structure 76 may be determined according to:

$$W_{2sil}=W_{1diff}-W_{3diff}-2W_s.$$

Following the determination of the width of the second refractory metal silicide structure 76 $W_{2sil}$, the difference ($\Delta W_{CD}$) between the width of the opening of the mask ($W_{2m}$) utilized to form the structure 76 and the actual width thereof $W_{2sil}$ may be determined according to:

$$\Delta W_{CD}=W_{2m}-W_{2sil}.$$

The sheet resistance of the second refractory metal silicide structure 76 $R_{\Box 2sil}$ is determined utilizing the width of the second refractory metal silicide structure 76. In particular, the sheet resistance of the second refractory metal silicide structure 76 $R_{\Box 2sil}$ is determined according to:

$$R_{\Box 2sil}=(R_{2sil}W_{2sil})/L.$$

$W_{2sil}$ may be determined in accordance with the method described above. $R_{2sil}$ may be measured utilizing the bridge resistor test structure 24. L is the device length of the third semiconductor structure 60 provided between voltage contacts 26a, 26b of the bridge test structure 24 for obtaining the resistance measurement $R_{2sil}$.

In the illustrated embodiment, second semiconductor structure 30 and third semiconductor structure 60 comprise respective first and second field effect transistors. The first and second field effect transistors have a common device width $W_d$. First refractory metal silicide structure 46 and second refractory metal silicide structure 76 respectively comprise a first gate and second gate of the field effect transistors.

The width of the second gate and the width of the diffusion region of the second field effect transistor are respectively referred to herein as $W_{2gate}$ and $W_{FETdiff}$. The sheet resistance and the measured resistance of the second gate are respectively referred to herein as $R_{2\Box gate}$ and $R_{2gate}$.

EXAMPLE

The following example illustrates the methods according to a preferred aspect of the present invention. Using the Van der Pauw structure 8, the sheet resistance ($R_{\Box sil}$) for a refractory metal silicide test structure 10, comprising polysilicon and a silicide layer, and having a width in excess of 0.5 micron is determined. The voltage (V) is 88 mVolts for a current (I) of 100 mA. Using the equation for a Van der Pauw structure 8 set forth above, the sheet resistance of the refractory metal silicide test structure is:

$$R_{\Box 1sil}=4.532\times V/I=4.532\times 0.088/0.1=3.988 \ 10^6 \ /sq.$$

Using the Van der Pauw structure 8, the sheet resistance ($R_{\Box diff}$) for a diffusion test structure 10 comprising a diffusion region is determined. The voltage (V) is 95 mVolts for a current (I) of 100 mA. The sheet resistance of the diffusion region is:

$$R_{\Box diff}=4.532\times V/I=4.532\times 0.095/0.1=4.3 \ \Omega/sq.$$

Utilizing the bridge resistor test structure 24, the resistance of the first diffusion region 21 of the first semiconductor structure 20 is determined. The measured resistance of the first diffusion region ($R_{1diff}$) is 22.63$\Omega$ for L=10 microns. In accordance with the above, the width of the first diffusion region 21 ($W_{1diff}$) is determined for L=10 microns according to:

$$W_{1diff}=(R_{\Box diff}\times L)/R_{1diff}=(4.3\times 10)/22.63=1.9 \text{ microns}.$$

A mask having an opening width ($W_{1m}$) of 2.0 microns is utilized to form the first diffusion region 21. Therefore, the difference ($\Delta W_{diff}$) between the width of the mask opening $W_{1m}$ and the width of the first diffusion region 21 $W_{1diff}$ is determined according to:

$$\Delta W_{diff}=W_{1m}-W_{1diff}=(2.0-1.9)=0.1 \text{ microns}.$$

Using the bridge resistor test structure 24, the resistance of the first refractory metal silicide structure 46 ($R_{1sil}$) of the second semiconductor structure 30 is determined. For a length L=10 microns, a voltage of 0.588 Volts is provided using a current of 10 mA. Thus, the resistance of the first refractory metal silicide structure 46 for L=10 microns is:

$$R_{1sil}=V/I=0.588/0.1=58.8\Omega.$$

The width of the first refractory metal silicide structure 46 ($W_{1sil}$) is determined for L=10 microns by:

$$W_{1sil}=(R_{\square sil}L)/R_{sil}=(3.988\times10)/58.8=0.678 \text{ microns.}$$

Utilizing the bridge resistor test structure 24, the resistance of the second diffusion region 36 ($R_{2diff}$) of the second semiconductor structure 30 is determined. For a length L=10 microns, a voltage of 0.392 Volts is measured using a current of 10 mA. Thus, the resistance of the second diffusion region 36 for L=10 microns is:

$$R_{2diff}=V/I=0.392/0.1=39.2\Omega.$$

The width of the second diffusion region 36 $W_{2diff}$ is determined for L=10 microns according to:

$$W_{2diff}=(R_{\square diff}\times L)/R_{2diff}=(4.3\times10)/39.2=1.096 \text{ microns.}$$

The width of the spacers 40, 70 ($W_s$) is determined using:

$$W_s=(W_{1diff}-W_{2diff}-W_{1sil})/2=(1.9-1.096-0.678)/2=0.063 \text{ microns.}$$

Utilizing the bridge resistor test structure 24, the resistance of the third diffusion region 66 ($R_{3diff}$) of the third semiconductor structure 60 is determined. For a length L=10 microns, a voltage of 0.285 Volts is measured using a current of 10 mA. Thus, the resistance of the third diffusion region 66 for L=10 microns is:

$$R_{3diff}=V/I=0.285/0.01=28.5\Omega.$$

The width of the third diffusion region 66 $W_{3diff}$ is determined for L=10 microns by:

$$W_{3diff}=(R_{\square diff}\times L)/R_{3diff}=(4.3\times10)/28.5=1.509 \text{ microns.}$$

The width of the second refractory metal silicide structure 76 ($W_{2sil}$) is determined by:

$$W_{2sil}=W_{1diff}-W_{3diff}-2W_s=(1.9-1.509-(2\times0.063))=0.265 \text{ microns.}$$

The width of the opening of the mask ($W_{2m}$) utilized to form the second refractory metal silicide structure 76 is 0.25 microns. Therefore, the difference ($\Delta W_{CD}$) between the width of the mask opening and the width of the second refractory metal silicide structure 76 is:

$$\Delta W_{CD}=W_{2m}-W_{2sil}=0.25-0.265=-0.015 \text{ microns.}$$

The negative sign indicates that the actual width of the second refractory metal silicide structure 76 is larger than the opening of the mask.

Utilizing the bridge resistor test structure 24, the resistance of the second refractory metal silicide structure 76 ($R_{2sil}$) is determined. For L=10 microns, a voltage of 2.65 Volts is measured using a current of 10 mA. Thus, the resistance for L=10 microns is:

$$R_{2sil}=V/I=2.65/0.01=265\Omega.$$

The sheet resistance of the second refractory metal silicide structure for L=10 microns is:

$$R_{2\square sil}=(R_{2sil}W_{2sil})/L=(265\times0.265)/10=7.02 \text{ }\Omega/sq.$$

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of determining a smallest dimension of a fabricated device on a semiconductor substrate comprising:

providing a first substrate area and a second substrate area;

subjecting the first substrate area and the second substrate area to the same processing conditions to achieve regions of like material on the first and second substrate areas, the like material on the first substrate area having a smallest dimension which is greater than a smallest dimension of the like material on the second substrate area;

determining parameters of the like material on the first substrate area; and after the determining parameters, determining said smallest dimension of the like material on the second substrate area using the determined parameters of the like material on the first substrate area.

2. The method according to claim 1 wherein the regions of like material are refractory metal silicide structures.

3. The method according to claim 2 wherein the refractory metal silicide structures comprise silicide and polysilicon.

4. The method according to claim 3 further comprising forming the silicide by salicide processing.

5. The method according to claim 1 wherein the smallest dimension of the like material on the second substrate area is the width.

6. The method according to claim 1 wherein the smallest dimension of the like material on the first substrate area is greater than or equal to 0.5 microns.

7. The method according to claim 1 further comprising forming a plurality of spacers individually having a width, the spacers comprising a part of the regions of like material.

8. The method according to claim 7 wherein the step of determining parameters includes calculating the width of the spacers.

9. The method according to claim 1 wherein the step of subjecting comprises forming a device within the first substrate area and a device within the second substrate area, the devices having at least one region of common width.

10. A method of determining a width of a structure comprising a second refractory metal silicide, the width being less than 0.5 microns, the method comprising:

forming first and second field effect transistors having a common device width, the first field effect transistor comprising a first gate comprising a first refractory metal silicide having a width of greater than or equal to 0.5 microns, the second field effect transistor comprising a diffusion region and a second gate comprising a second refractory metal silicide having a width of less than 0.5 microns, the first and second gates having insulative lateral spacers of a substantially common width and common material;

determining the common device width;

determining the common width of the insulative lateral spacers;

determining the width of the diffusion region of the second field effect transistor; and determining the width of the second gate using the common device width, the width of the diffusion region of the second field effect transistor and the common width of the insulative lateral spacers.

11. The method according to claim 10 wherein the width of the second gate is determined according to:

$$W_{2gate} = W_d - W_{FETdiff} - 2W_s$$

where said $W_{2gate}$ is the width of the second gate; said $W_d$ is the common device width; said $W_{FEDdiff}$ is the width of the diffusion region of the second field effect transistor; and said $W_s$ is the width of individual ones of the insulative lateral spacer.

12. The method according to claim 10 further comprising determining the measured resistance of the second gate.

13. The method according to claim 12 further comprising determining the sheet resistance of the second gate.

14. The method according to claim 13 wherein the sheet resistance of the second gate is determined according to:

$$R_{2\square gate} = (R_{2gate} W_{2gate})/L$$

where said $R_{2\square gate}$ is the sheet resistance of the second gate; said L is the length of the second gate; said $R_{2gate}$ is the measured resistance of the second gate; and said $W_{2gate}$ is the width of the second gate.

15. A method of determining parameters of a semiconductor device comprising a refractory metal silicide comprising:

providing a first semiconductor structure having a first device length and including a diffusion region having a diffusion width;

determining the diffusion width of the diffusion region of the first semiconductor structure;

providing a second semiconductor structure having a second device length and including a first refractory metal silicide structure having a first width and a first spacer having a spacer width;

determining the spacer width;

providing a third semiconductor structure having a third device length and including a second refractory metal silicide structure having a second width and a second spacer of the spacer width, the second width being less than the first width, the first refractory metal silicide structure and the second refractory metal silicide structure being formed of the same refractory metal silicide; and determining the second width using at least the determined diffusion width and the determined spacer width.

16. The method according to claim 15 wherein the first and second refractory metal silicide structures comprise silicide and polysilicon.

17. The method according to claim 16 further comprising forming the silicide by salicide processing.

18. The method according to claim 15 further comprising determining the measured resistance of the diffusion region of the first semiconductor structure.

19. The method according to claim 15 further comprising determining the diffusion sheet resistance of the diffusion region of the first semiconductor structure.

20. The method according to claim 19 wherein the determining of the diffusion width of the first semiconductor structure is determined according to:

$$W_{1diff} = (R_{\square diff} L)/R_{1diff}$$

where said $W_{1diff}$ is the diffusion width of the diffusion region of the first semiconductor structure; said $R_{1diff}$ is the measured resistance of the first semiconductor structure; said $R_{\square diff}$ is the diffusion sheet resistance of the diffusion region of the first semiconductor structure; and said L is the first device length of the first semiconductor structure.

21. The method according to claim 15 wherein the second semiconductor structure includes a diffusion region.

22. The method according to claim 21 further comprising determining the diffusion sheet resistance of the diffusion region of the second semiconductor structure.

23. The method according to claim 21 further comprising determining the diffusion width of the diffusion region of the second semiconductor substrate.

24. The method according to claim 23 further comprising determining the measured resistance of the diffusion region of the second semiconductor structure.

25. The method according to claim 24 wherein the diffusion width of the diffusion region of the second semiconductor structure is determined according to:

$$W_{2diff} = (R_{\square diff} L)/R_{2diff}$$

where said $W_{2diff}$ is the diffusion width of the second semiconductor structure; said $R_{\square diff}$ is the diffusion sheet resistance; said $R_{2diff}$ is the measured resistance of the diffusion region of the second semiconductor structure; and said L is the second device length of the second semiconductor structure.

26. The method according to claim 15 further comprising determining the measured resistance of the first refractory metal silicide structure.

27. The method according to claim 26 further comprising determining the sheet resistance of the first refractory metal silicide structure.

28. The method according to claim 27 further comprising determining the width of the first refractory metal silicide structure.

29. The method according to claim 28 wherein the width of the first refractory metal silicide structure is determined according to:

$$W_{1sil} = (R_{1\square sil} L)/R_{1sil}$$

where said $W_{1sil}$ is the width of the first refractory metal silicide structure; said $R_{1sil}$ is the measured resistance of the first refractory metal silicide structure; said $R_{1\square sil}$ is the sheet resistance of the first refractory metal silicide structure; and said L is the third device length of the second semiconductor structure.

30. The method according to claim 15 wherein the second semiconductor structure includes a diffusion region and further comprising determining the width of the diffusion region of the second semiconductor structure.

31. The method according to claim 30 wherein the determining of the spacer width is determined according to:

$$W_s = (W_{1diff} - W_{2diff} W_{1sil})/2$$

where said $W_s$ is the spacer width; said $W_{1diff}$ is the diffusion width of the diffusion region of the first semiconductor structure; said $W_{2diff}$ is the width of the diffusion region of the second semiconductor structure; and said $W_{1sil}$ is the first width of the first refractory metal silicide structure.

32. The method according to claim 15 wherein the third semiconductor structure includes a diffusion region and further comprising determining the measured resistance of the diffusion region of the third semiconductor structure.

33. The method according to claim 32 further comprising determining the diffusion sheet resistance of the diffusion regions of the first, second and third semiconductor structures.

34. The method according to claim 33 further comprising determining the diffusion width of the diffusion region of the third semiconductor structure.

35. The method according to claim 34 wherein the diffusion width of the diffusion region of the third semiconductor structure is determined according to:

$$W_{3diff} = (R_{\square diff} L)/R_{3diff}$$

where said $W_{3diff}$ is the diffusion width of the diffusion region of the third semiconductor structure; said $R_{\square diff}$ is the diffusion sheet resistance: said L is the length of the third semiconductor structure; and said $R_{3diff}$ is the measured resistance of the diffusion region of the third semiconductor structure.

36. The method according to claim 32 wherein the determining the width of the second refractory metal silicide structure is determined according to:

$$W_{2sil} = W_{1diff} - W_{3diff} - 2W_s$$

where said $W_{2sil}$ is the width of the second refractory metal silicide structure; said $W_{1diff}$ is the diffusion width of the first semiconductor structure; said $W_{3diff}$ is the width of the diffusion region of the third semiconductor structure; and said $W_s$ is the spacer width of the second spacer.

37. The method according to claim 15 further comprising determining the measured resistance of the second refractory metal silicide structure.

38. The method according to claim 37 further comprising determining the sheet resistance of the second refractory metal silicide structure.

39. The method according to claim 38 wherein the sheet resistance of the second refractory metal silicide structure is determined according to:

$$R_{\square 2sil} = (R_{2sil} W_{2sil})/L$$

where said $R_{\square 2sil}$ is the sheet resistance of the second refractory metal silicide structure; said $R_{2sil}$ is the measured resistance of the second refractory metal silicide structure; $W_{2sil}$ is the second width of the second refractory metal silicide structure; and said L is the length of the third semiconductor structure.

40. The method according to claim 15 wherein the first width of the first refractory metal silicide structure is greater than 0.5 microns.

41. The method according to claim 15 wherein the second width of the second refractory metal silicide structure is less than 0.5 microns.

42. The method according to claim 15 wherein the first semiconductor structure, second semiconductor structure and third semiconductor structure respectively have a common device width.

43. A method of determining the width of an insulative spacer of a semiconductor device, comprising:
providing a first semiconductor structure comprising a first diffusion region, the first semiconductor structure having a device width;
providing a second semiconductor structure of the device width and comprising a refractory metal silicide structure, a second diffusion region and the insulative spacer;
determining the device width;
determining the width of the refractory metal silicide structure;
determining the diffusion width of the second diffusion region; and
subtracting the width of the refractory metal silicide structure and the diffusion width of the second diffusion region from the device width.

44. The method according to claim 43 further comprising determining the measured resistance of the first diffusion region.

45. The method according to claim 44 further comprising determining the diffusion sheet resistance.

46. The method according to claim 45 wherein the device width is equal to a first diffusion width of the first semiconductor structure.

47. The method according to claim 46 further comprising determining the diffusion width of the first diffusion region.

48. The method according to claim 47 wherein the step of determining of the diffusion width of the first diffusion region is determined according to:

$$W_{1diff} = (R_{\square diff} L)/R_{1diff}$$

where said $W_{1diff}$ is the diffusion width of the first diffusion region; said $R_{1diff}$ is said measured resistance of the first diffusion region; said L is the device length of the first semiconductor structure; and said $R_{\square diff}$ is said diffusion sheet resistance.

49. The method according to claim 43 further comprising determining the measured resistance and the sheet resistance of the refractory metal silicide structure and the measured resistance of the second diffusion region.

50. The method according to claim 49 wherein said diffusion width of the second diffusion region is determined according to:

$$W_{2diff} = (R_{\square diff} L)/R_{2diff}$$

where said $W_{2diff}$ is said diffusion width of the second diffusion region; said $R_{\square diff}$ is the diffusion sheet resistance; said $R_{2diff}$ is said measured resistance of the second diffusion region; and said L is the device length of the second semiconductor structure.

51. The method according to claim 43 wherein said width of the refractory metal silicide structure is determined according to:

$$W_{sil} = (R_{\square sil} L)/R_{sil}$$

where said $W_{sil}$ is the refractory metal silicide structure; said $R_{sil}$ is the measured resistance of the refractory metal silicide structure; said $R_{\square sil}$ is the sheet resistance of the refractory metal silicide structure; and said L is the device length of the second semiconductor structure.

52. The method according to claim 51 further comprising determining the diffusion width of the first diffusion region.

53. A method of determining parameters of a semiconductor device comprising a refractory metal silicide, the method comprising the steps of:
providing a diffusion test structure having a first sheet resistance;

providing a refractory metal silicide test structure having a second sheet resistance;

determining the first sheet resistance;

determining the second sheet resistance;

forming a first semiconductor structure having a device width and a first diffusion region;

determining the width of the first diffusion region;

forming a second semiconductor structure of the device width and having: a second diffusion region including a plurality of first parallel diffusion areas, a first refractory metal silicide structure having a width of at least 0.5 micron, and a first spacer having a spacer width;

determining the measured resistance of the first refractory metal silicide structure;

determining the measured resistance of the second diffusion region;

determining the width of the first refractory metal silicide structure;

determining the width of the second diffusion region;

determining the spacer width;

forming a third semiconductor structure of the device width and having: a third diffusion region including a plurality of second parallel diffusion areas, a second refractory metal silicide structure having a width less than 0.5 micron, and a second spacer of the spacer width, the first refractory metal silicide structure and the second refractory metal silicide structure being formed of the same refractory metal silicide;

determining the measured resistance of the third diffusion region;

determining the measured resistance of the second refractory metal silicide structure;

determining the width of the third diffusion region;

determining the width of the second refractory metal silicide structure;

determining a difference between the width of the second refractory metal silicide structure and a width of a mask opening from which the second refractory metal silicide structure was patterned; and determining the refractory metal silicide sheet resistance of the second refractory metal silicide structure.

* * * * *

UNITED STATES PATENT AND TRADEMARK OFFICE
CERTIFICATE OF CORRECTION

PATENT NO. : 5,963,784
DATED : October 5, 1999
INVENTOR(S) : Subhas Bothra et al.

It is certified that error appears in the above-identified patent and that said Letters Patent is hereby corrected as shown below:

Column 11, line 13: replace "$W_{FEDdiff}$" with --$W_{FETdiff}$--.

Signed and Sealed this

Twenty-third Day of May, 2000

Attest:

Q. TODD DICKINSON

*Attesting Officer*   *Director of Patents and Trademarks*